United States Patent [19]

Nyswander

[11] 4,042,837

[45] Aug. 16, 1977

[54] SHORT PULSE SOLID STATE-MAGNETIC MODULATOR FOR MAGNETRON TRANSMITTER

[75] Inventor: Reuben E. Nyswander, China Lake, Calif.

[73] Assignee: The United States of America as represented by the Secretary of the Navy, Washington, D.C.

[21] Appl. No.: 741,904

[22] Filed: Nov. 15, 1976

[51] Int. Cl.² .......................... H03K 1/18; H03K 3/57
[52] U.S. Cl. ................................ 307/265; 307/252 L; 307/246; 328/65
[58] Field of Search ............ 307/252 J, 252 K, 252 L, 307/246, 265, 266; 328/65

[56] References Cited

U.S. PATENT DOCUMENTS

| | | | |
|---|---|---|---|
| 3,486,043 | 12/1969 | Johannessen | 328/65 X |
| 3,662,189 | 5/1972 | Robinson et al. | 307/252 L |
| 3,737,679 | 6/1973 | Cooper | 328/65 X |
| 3,881,120 | 4/1975 | Osterwalder | 328/65 X |
| 3,928,809 | 12/1975 | Tschudi et al. | 307/265 X |

Primary Examiner—John S. Heyman
Attorney, Agent, or Firm—R. S. Sciascia; Roy Miller

[57] ABSTRACT

A solid state, magnetic modulator for a magnetron transmitter having a portion of its storage circuit coupled to discharge through a series of SCR switching modules such that the charge on the remainder of the storage circuit and the discharge overshoot are additive to provide a high power pulse of extremely short duration to the magnetron.

6 Claims, 1 Drawing Figure

SHORT PULSE SOLID STATE-MAGNETIC MODULATOR FOR MAGNETRON TRANSMITTER

BACKGROUND OF THE INVENTION

Modulators using solid state switches, magnetic switches, and combinations of the two have been used in recent years for driving magnetron transmitters in radar systems. These devices have been capable of generating pulses no shorter than 100 nanoseconds in duration.

In prior art devices a saturable reactor or transformer is used to perform the final, fast switching which generates the output pulse. The present invention uses a unique, lumped constant delay line composed of series inductances and shunt capacitors. Each series inductance is a saturable reactor switch. Two to five sections have been used, with each section consisting of a series saturable reactor and a shunt capacitance. The initial switching is performed by the string of series SCR modules, across which is connected the lumped constant delay line. The switching transient travels down the delay line as the saturable reactors switch in sequence. With each switching action the transient is sharpened and increased in amplitude. The load, in this case the primary of the pulse transformer, is connected in series with the last section of the delay line. When the last saturable reactor switches, a very short pulse is applied to the magnetron.

In prior art devices, the low impedance level of the switching modules is matched to the high impedance of the magnetron by one or more pulse transformers having a high, overall step-up ratio. This adds series inductance and shunt capacitance to the discharge circuit and sets a lower limit on pulse duration. The present invention uses a number of switching modules in series. The voltage and impedance level of the series combination is proportional to the number of modules used. The higher impedance of the switching circuit can now be matched to the magnetron using a pulse transformer having a relatively low step-up ratio. This reduces series inductance and shunt capacitance and makes it possible to generate shorter pulses.

Some solid state, magnetic modulator circuits typically require a bias current in the saturable transformer which couples the low level pulse generator to the output pulse generator circuit. The required value must be controlled in a closed loop servo system. The present invention has no bias requirements.

BRIEF DESCRIPTION OF THE DRAWING

The FIGURE is a schematic of a preferred embodiment of the present invention.

DESCRIPTION OF A PREFERRED EMBODIMENT

Figure 1:
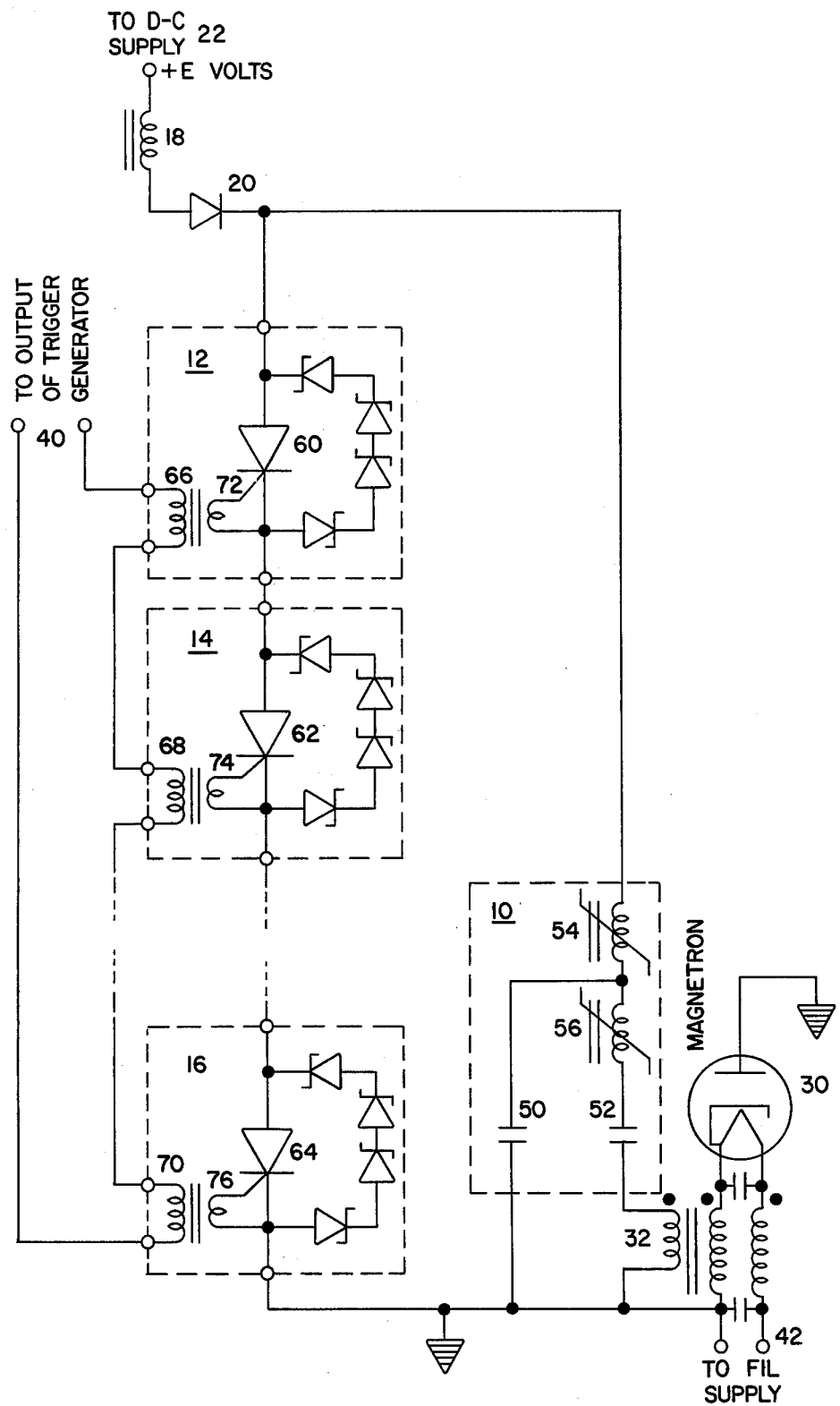

The FIGURE is a simplified schematic diagram of an embodiment of the present invention. Shown are lumped constant delay line 10 (shown with two sections), modules 12, 14, 16, and current charging circuit components 18 and 20 coupled to voltage source 22, along with magnetron 30 and pulse transformer 32. Switching modules 12, 14, and 16 are gated by the output of a trigger generator coupled to input 40. A filament supply is provided at input 42 to magnetron 30.

Initially, capacitors 50 and 52 of network 10 are charged to 2E. Modules 12, 14, and 16 are then simultaneously rendered conductive by the trigger generator creating a discharge path for capacitor 50 through indicator 54. Inductor 54 saturates and capacitor 50 discharges rapidly, resulting in an inductive overshoot which leaves a negative voltage on capacitor 50. The charge on capacitors 50 and 52 are then additive, and provide a high power discharge of short duration through inductor 56 and the primary of pulse transformer 32. Thereby, a high power pulse of short duration is coupled to magnetron 30.

Now, in greater detail: D-C resonance charging is employed to charge capacitors 50 and 52 to a voltage of 2E. Inductor 18 is resonant with the parallel combination of capacitors 50 and 52 at some frequency, $f$. The pulse recurrence frequency (PRF) for resonance charging is: PRF = $\frac{1}{2}f$. Diode 20 is used as a conventional hold-off diode. It prevents capacitors 50 and 52 from discharging back into the power supply 22, which might otherwise occur in the event the PRF were reduced below $\frac{1}{2}f$. Inductors 54 and 56 are saturable reactors, and will be described later.

The present invention may include any number of switching modules couple as shown in the FIGURE. The addition of another module to that which may be employed at any one time would simply increase the high voltage level that could be withstood by the module assemblage. That is, any given component has an operable range, and if that range is exceeded the component will be destroyed. By adding additional components the stress on any one in the arrangement shown is reduced. If silicon controlled rectifiers (SCR) had sufficient high voltage handling capabilities for the intended application, a single module would be sufficient.

Modules 12, 14, and 16 are identical. The SCR in each module (SCR's 60, 62, and 64) is triggered by individual pulse transformers 66, 68, and 70 respectively. The primaries of the transformers are connected in series, and the series combination in turn is coupled at terminals 40 to a trigger generator.

Transformers 66, 68, and 70 provide electrical isolation for the gate-source connection of each SCR 60, 62, and 64, permitting each gate to float at the proper voltage level. Also, they match the relatively high impedance output of the trigger generator to the low impedance inputs of the SCR gates 72, 74, and 76. The transformers 66, 68, and 70, in addition, make it possible to drive gates 72, 74, and 76 in series so that if the input impedance to one or more of the gates drops, the current into all of the gates will increase. Thereby, triggering of the remaining SCR's is speeded up, which will insure that all SCR's trigger almost simultaneously.

At least one zener diode is coupled across each SCR. The total zener voltage is selected to be slightly less than the maximum forward hold-off voltage rating of the SCR. This insures that the forward charging voltage, 2E, will be equally divided across each of the SCR's, and, further, that the forward voltage on any one SCR will never exceed its ratings. The zeners also act as a shunt diode, as in a conventional modulator circuit. They conduct in the forward direction if there is a negative charge left on capacitors 50 and 52 following a modulator pulse. Negative voltages across the SCR's are thereby prevented following their period of conduction.

A total of four diodes are shown across each SCR in the FIGURE. That demonstrates an operable condition when presently available zener diodes are employed with a type 2N4204 SCR. Such a SCR has a very short turn-on time and quick recovery. It will hold off a maximum of 800 volts and switch a maximum pulse current of 100 amperes.

When SCR's 60, 62 and 64 are triggered, most of voltage 2E on capacitors 50 and 52 suddenly appears across inductor 54. However, very little current flows because of its reactance. Then the core of inductor 54 saturates and its inductance drops dramatically. Capacitor 50 then discharges rapidly through inductor 54 and switching modules 12, 14, and 16.

The delay introduced by inductor 54 also serves to protect the SCR's. Inductor 54 limits current build-up which permits the junction region of each SCR to breakdown evenly over its entire area rather than in only one spot. As a result, "hotspots" and burnouts are prevented.

The rapid discharge of capacitor 50 through the residual inductance of inductor 54 results in an inductive overshoot which leaves a negative charge on capacitor 50. If there were no losses in the circuit, the negative voltage on capacitor 50 would equal 2E. However, due to losses, the negative voltage has been found to be approximately 1.7E in a typical case.

The core of inductor 54 is now saturated in the direction which gives it a large reactance to the negative voltage impressed across it from the negative charge on capacitor 50. Therefore, capacitor 50 cannot begin to discharge back through inductor 54 prior to reversion to its original polarity, a period typically of 100 to 200 nanoseconds.

A negative voltage of 1.7E on capacitor 50 and positive voltage of 2E on capacitor 52 are additive to give a net voltage of approximately 3.7E across inductor 56. As a result, the core of inductor 56 saturates quickly, causing its inductance to suddenly drop to a low value. The capacitors discharge in a series through inductor 56, and through the primary winding of pulse transformer 32, generating the modulator output pulse.

Immediately following the output pulse, the cores of inductors 54 and 56 remain saturated in the opposite polarity to that which they were at the start of the switching sequence. They must be switched back to their original polarities before the next modulator pulse can be initiated. The resetting is accomplished by the charging current that flows into capacitors 50 and 52 from source 22 on the next resonance charging cycle.

Inductors 54 and 56 should have a very fast switching characteristic and a high squareness ratio. An operable embodiment of the present invention employed ten toroids for each inductor. Each toroid was wound with five turns of copper strip. The ten individual windings were connected in series and were vacuum impregnated in silicone oil to prevent arc-over across the core laminations. 25D250-170-AA toroids of one-quarter mil tape-wound bobbin cores are available from Arnold Engineering.

The present invention is capable of generating much shorter pulse durations than prior devices because the inductance, and therefore the impedance, in the output circuit is relatively low. The low inductance is due to the circuit's ability to use a number of fast switching toroids. Such toroids can not be used in the saturable transformers of conventional circuits because they are only available in small sizes with very low cross-sectional core area.

Additionally, the output pulse is generated of a high voltage level, made possible by the use of a number of SCR's in series.

Also, the output voltage is approximately 1.8 times larger for a given power supply input voltage as contrasted with a conventional, line-type modulator circuit. This reduces the required step-up ratio of the output pulse transformer.

What is claimed is;

1. A magnetic modulator for generating short pulses for a magnetron transmitter comprising:
   an electrical charge source having a voltage E;
   storage means coupled to said source adapted to store a charge with a resultant voltage 2E;
   said storage means having at least two conductive paths;
   a storage element in each of said conductive paths adapted to be charged to a voltage 2E;
   switching means coupled across said storage means including means in one of said at least two conductive paths for providing discharge path for one of said at least two storage elements so that discharge takes place in a relatively short time resulting in an overshoot whereby said one of said at least two storage elements after discharge has a voltage thereon negative in polarity to that originally thereon;
   means included in the other of said at least two conductive paths for providing the resulting negative charge on said at least one storage element to be additive with the charge on the other of said at least two storage elements thereby resulting in a resultant output pulse for said magnetron transmitter having a value approximately 4E.

2. A magnetic modulator as set forth in claim 1 wherein;
   each of said conducting path means is an inductive reactor.

3. A magnetic modulator as set forth in claim 2 wherein;
   the discharge path for said one of said at least two storage elements comprises said switching means in series with the inductive reactor in one of said at least two conductive paths.

4. A magnetic modulator as set forth in claims 2 and further including;
   pulse transformer means connected in series in the other of said at least two conductive paths.

5. A magnetic modulator as set forth in claim 4 wherein;
   the discharge path for said one of said at least two storage elements when it has said negative charge thereon comprising said other of said at least two conductive paths and said pulse transformer means whereby a very short pulse results.

6. A magnetic modulator as set forth in claim 5 including;
   a magnetron operatively coupled to said pulse transformer means and receiving said very short pulse.

* * * * *